United States Patent
Kato et al.

(10) Patent No.: US 9,305,954 B2
(45) Date of Patent: Apr. 5, 2016

(54) SOLID-STATE IMAGE SENSOR AND CAMERA UTILIZING LIGHT ATTENUATING FILMS

(71) Applicant: CANON KABUSHIKI KAISHA, Tokyo (JP)

(72) Inventors: Satoshi Kato, Kawasaki (JP); Hideo Kobayashi, Tokyo (JP); Masanori Ogura, Tokyo (JP); Yukihiro Kuroda, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/200,730

(22) Filed: Mar. 7, 2014

(65) Prior Publication Data
US 2014/0253767 A1    Sep. 11, 2014

(30) Foreign Application Priority Data
Mar. 11, 2013 (JP) .................................. 2013-048489

(51) Int. Cl.
*H01L 27/146* (2006.01)
*H04N 5/355* (2011.01)
*H04N 9/04* (2006.01)

(52) U.S. Cl.
CPC .... *H01L 27/14625* (2013.01); *H01L 27/14621* (2013.01); *H04N 5/35563* (2013.01); *H04N 9/045* (2013.01)

(58) Field of Classification Search
CPC ................................................ H04N 5/35563
See application file for complete search history.

(56) References Cited

U.S. PATENT DOCUMENTS

| | | | |
|---|---|---|---|
| 5,121,225 A | 6/1992 | Murata et al. | |
| 5,261,013 A | 11/1993 | Murata et al. | |
| 5,475,211 A | 12/1995 | Ogura et al. | |
| 6,787,824 B2 | 9/2004 | Takeuchi et al. | |
| 6,831,692 B1 * | 12/2004 | Oda ................. | H01L 27/14621 250/208.1 |
| 7,227,208 B2 | 6/2007 | Ogura et al. | |
| 7,321,110 B2 | 1/2008 | Okita et al. | |
| 7,408,210 B2 | 8/2008 | Ogura et al. | |
| 7,456,880 B2 | 11/2008 | Okita et al. | |
| 7,460,162 B2 | 12/2008 | Koizumi et al. | |
| 7,514,732 B2 | 4/2009 | Okita et al. | |
| 7,550,793 B2 | 6/2009 | Itano et al. | |
| 7,605,415 B2 | 10/2009 | Koizumi et al. | |
| 7,629,568 B2 | 12/2009 | Koizumi et al. | |
| 7,638,826 B2 | 12/2009 | Hiyama et al. | |
| 7,679,658 B2 | 3/2010 | Sakurai et al. | |
| 7,719,587 B2 | 5/2010 | Ogura et al. | |
| 7,741,593 B2 | 6/2010 | Iwata et al. | |

(Continued)

FOREIGN PATENT DOCUMENTS

JP          2004032059 A      1/2004

*Primary Examiner* — Albert Cutler
(74) *Attorney, Agent, or Firm* — Fitzpatrick, Cella, Harper & Scinto

(57) ABSTRACT

A sensor has first pixels each including one of red, green and blue color filters, and second pixels each including one of red, green and blue color filters. In the first and second pixels including color filters of the same color, light transmittances of the light transmissive portions are different. A light transmittance of the light transmissive portion of the first pixel including the red color filter is lower than that of the light transmissive portion of the first pixel including the green color filter, and a light transmittance of the transmissive portion of the first pixel including the green color filter is lower than that of the light transmissive portion of the first pixel including the blue color filter.

12 Claims, 14 Drawing Sheets

(56) References Cited

U.S. PATENT DOCUMENTS

| | | | |
|---|---|---|---|
| 7,808,537 B2 | 10/2010 | Fujimura et al. | |
| 7,812,873 B2 | 10/2010 | Hiyama et al. | |
| 7,812,876 B2 | 10/2010 | Hiyama et al. | |
| 7,817,199 B2 | 10/2010 | Yamashita et al. | |
| 7,906,755 B2 | 3/2011 | Koizumi et al. | |
| 7,907,196 B2 | 3/2011 | Ogura et al. | |
| 7,911,521 B2 | 3/2011 | Kuroda et al. | |
| 7,935,995 B2 | 5/2011 | Watanabe et al. | |
| 7,943,975 B2 | 5/2011 | Koizumi et al. | |
| 7,948,540 B2 | 5/2011 | Ogura et al. | |
| 7,978,241 B2 | 7/2011 | Koizumi et al. | |
| 7,990,440 B2 | 8/2011 | Kobayashi et al. | |
| 8,053,718 B2 | 11/2011 | Koizumi et al. | |
| 8,063,958 B2 | 11/2011 | Okita et al. | |
| 8,084,729 B2 | 12/2011 | Kato et al. | |
| 8,134,190 B2 | 3/2012 | Okita et al. | |
| 8,154,639 B2 | 4/2012 | Kato et al. | |
| 8,159,582 B2 | 4/2012 | Kato et al. | |
| 8,169,525 B2 | 5/2012 | Ryoki et al. | |
| 8,174,599 B2 | 5/2012 | Kuroda et al. | |
| 8,174,600 B2 | 5/2012 | Ogura et al. | |
| 8,207,561 B2 | 6/2012 | Koizumi et al. | |
| 8,218,050 B2 | 7/2012 | Ogura et al. | |
| 8,222,682 B2 | 7/2012 | Watanabe et al. | |
| 8,223,238 B2 | 7/2012 | Kuroda et al. | |
| 8,309,898 B2 | 11/2012 | Kato et al. | |
| 8,345,137 B2 | 1/2013 | Shinohara et al. | |
| 8,390,708 B2 | 3/2013 | Koizumi et al. | |
| 8,390,713 B2 | 3/2013 | Kuroda et al. | |
| 8,411,178 B2 | 4/2013 | Ogura et al. | |
| 8,416,329 B2 | 4/2013 | Hiyama et al. | |
| 8,441,558 B2 | 5/2013 | Okita et al. | |
| 8,477,224 B2 | 7/2013 | Ogura et al. | |
| 8,493,487 B2 | 7/2013 | Takada et al. | |
| 8,520,102 B2 | 8/2013 | Ogura et al. | |
| 8,520,108 B2 | 8/2013 | Ogura et al. | |
| 8,552,481 B2 | 10/2013 | Hiyama et al. | |
| 8,624,307 B2 | 1/2014 | Koizumi et al. | |
| 8,670,058 B2 | 3/2014 | Hayashi et al. | |
| 8,675,107 B2 | 3/2014 | Yamashita et al. | |
| 8,698,935 B2 | 4/2014 | Okita et al. | |
| 8,710,558 B2 | 4/2014 | Inoue et al. | |
| 8,749,675 B2 | 6/2014 | Koizumi et al. | |
| 2004/0017497 A1* | 1/2004 | Suzuki et al. | 348/315 |
| 2004/0109068 A1* | 6/2004 | Mitsunaga et al. | 348/222.1 |
| 2007/0296843 A1 | 12/2007 | Kasuga et al. | |
| 2008/0265349 A1* | 10/2008 | Kasano | G03B 11/00 257/432 |
| 2009/0284630 A1* | 11/2009 | Itonaga | 348/294 |
| 2009/0298220 A1* | 12/2009 | Anderson et al. | 438/70 |
| 2010/0013969 A1 | 1/2010 | Ui | |
| 2010/0314530 A1 | 12/2010 | Hiyama et al. | |
| 2011/0141333 A1* | 6/2011 | Naruse | H01L 27/14621 348/308 |
| 2011/0228149 A1* | 9/2011 | Naruse | H01L 27/14627 348/273 |
| 2011/0278438 A1 | 11/2011 | Kobayashi | |
| 2012/0273657 A1 | 11/2012 | Kobayashi | |
| 2013/0063635 A1 | 3/2013 | Kobayashi | |
| 2013/0082343 A1 | 4/2013 | Fudaba et al. | |
| 2013/0140440 A1 | 6/2013 | Kobayashi | |
| 2013/0140608 A1 | 6/2013 | Kuroda et al. | |
| 2013/0140665 A1 | 6/2013 | Koizumi et al. | |
| 2013/0194470 A1 | 8/2013 | Ogura et al. | |
| 2013/0221199 A1 | 8/2013 | Kato | |
| 2013/0313413 A1 | 11/2013 | Kato | |
| 2013/0313622 A1 | 11/2013 | Kuroda | |
| 2014/0002690 A1 | 1/2014 | Hiyama et al. | |
| 2014/0320695 A1* | 10/2014 | Ozawa | H04N 5/35563 348/229.1 |

* cited by examiner

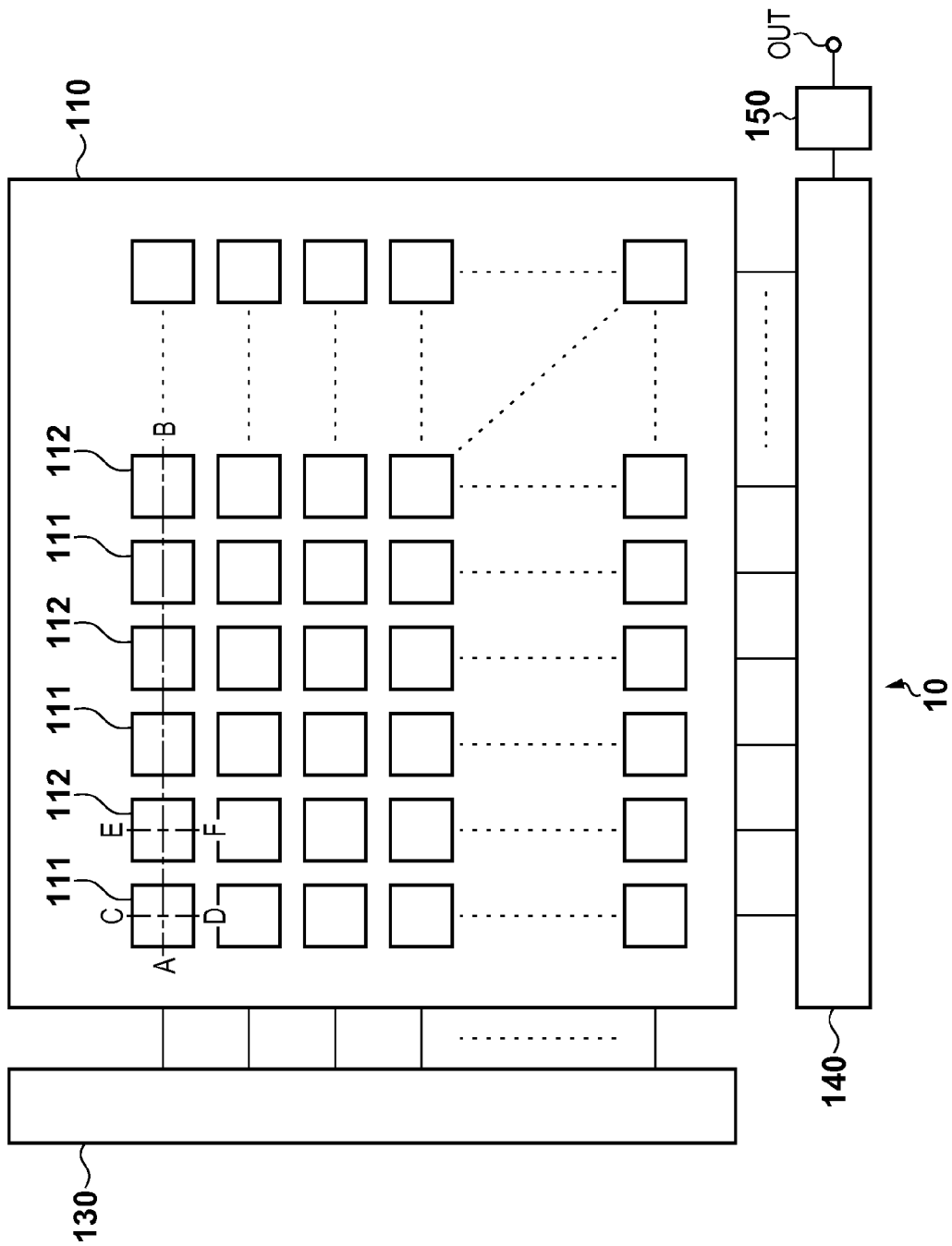

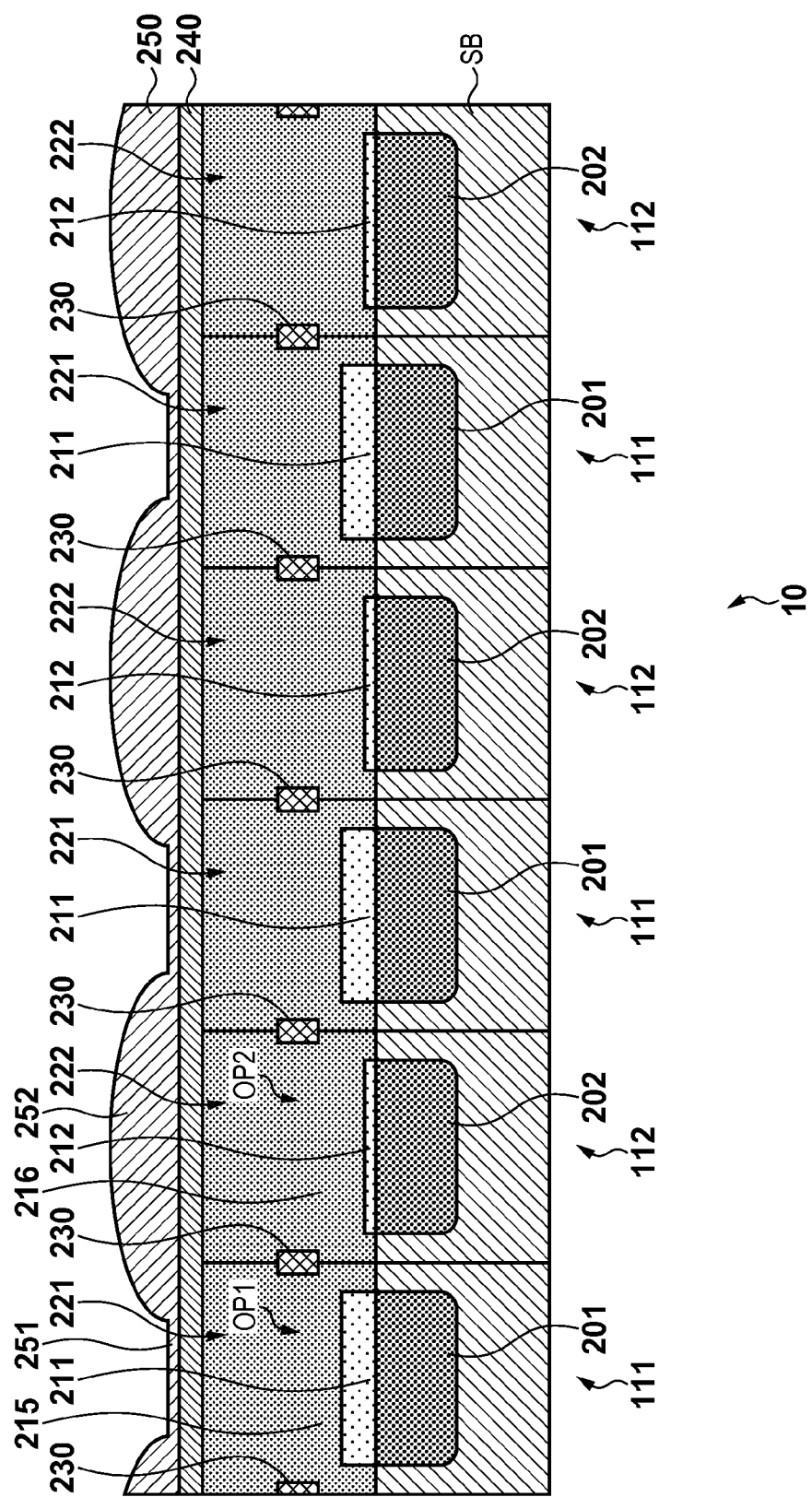

C-D SECTION

E-F SECTION

FIG. 4A
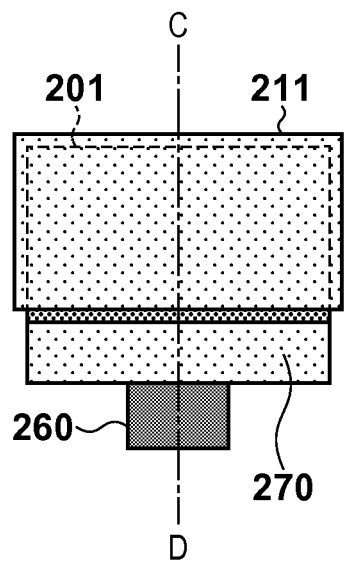
FIG. 4B
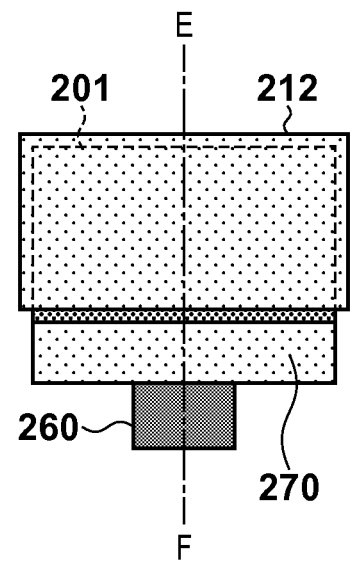

C-D SECTION

E-F SECTION

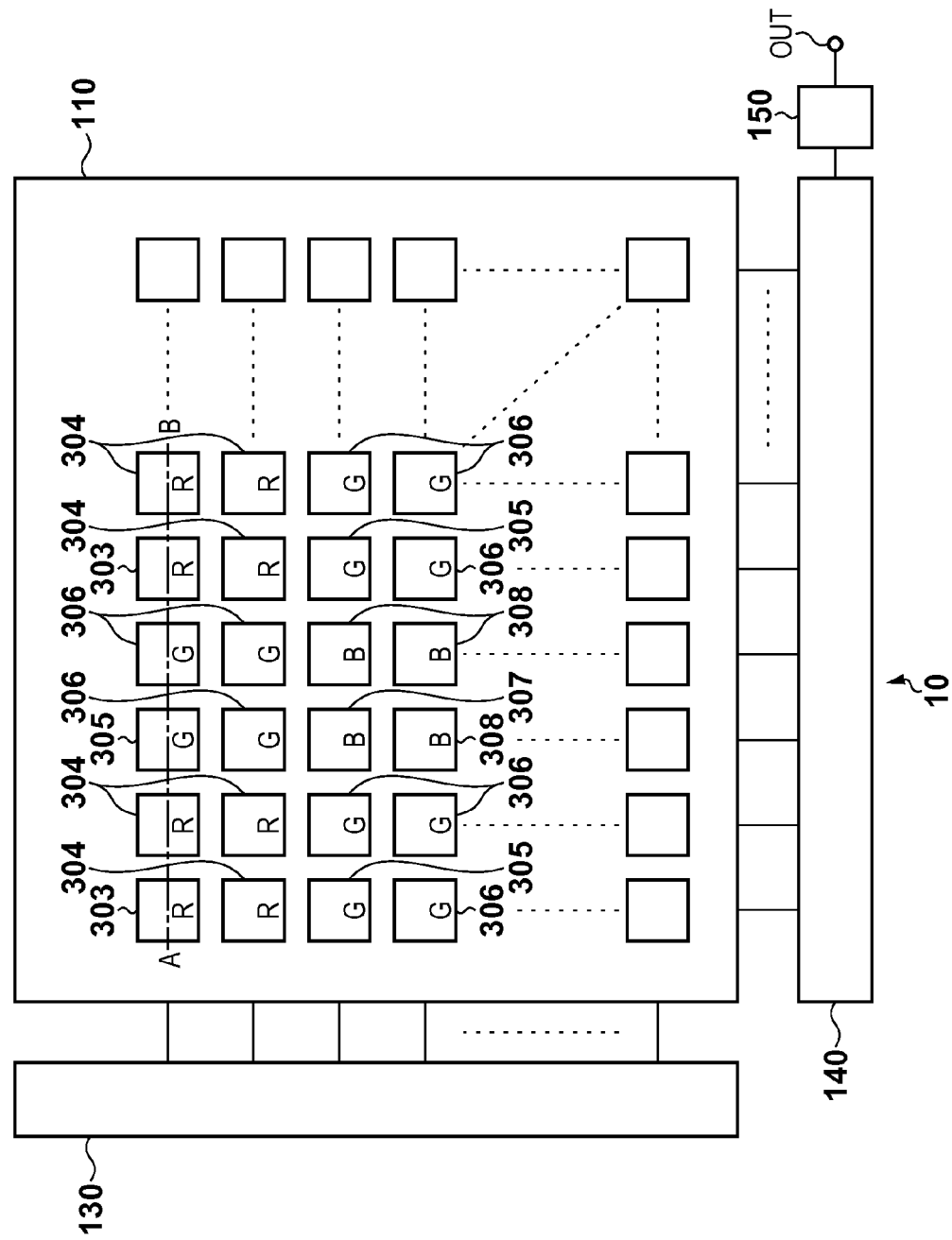

SOLID-STATE IMAGE SENSOR AND CAMERA UTILIZING LIGHT ATTENUATING FILMS

BACKGROUND OF THE INVENTION

1. Field of the Invention

The present invention relates to a solid-state image sensor and camera.

2. Description of the Related Art

Japanese Patent Laid-Open No. 2004-32059 describes that in order to widen the dynamic range of a solid-state image sensor, a highly sensitivity pixel and low sensitive pixel are formed, and a microlens is formed in only the highly sensitivity pixel of the highly and low sensitivity pixels.

To obtain a wider dynamic range, however, the idea described in Japanese Patent Laid-Open No. 2004-32059 is insufficient. In particular, Japanese Patent Laid-Open No. 2004-32059 has no idea of attenuating light entering the low sensitive pixel in order to widen the dynamic range on a high-illumination side, that is, widen the dynamic range of the low sensitive pixel.

SUMMARY OF THE INVENTION

The present invention provides a technique advantageous in further widening a dynamic range.

One of aspects of the present invention provides a solid-state image sensor comprising a plurality of first pixels each including one of a red color filter, a green color filter, and a blue color filter, and a plurality of second pixels each including one of a red color filter, a green color filter, and a blue color filter, wherein each of the plurality of first pixels includes a first photoelectric converter, and a first light transmissive portion arranged above the first photoelectric converter, and each of the plurality of second pixels includes a second photoelectric converter, and a second light transmissive portion arranged above the second photoelectric converter, in the first pixel and the second pixel including color filters of the same color, light transmittances of the first light transmissive portion and the second light transmissive portion are different, and a light transmittance of the first light transmissive portion of the first pixel including the red color filter is lower than that of the first light transmissive portion of the first pixel including the green color filter, and a light transmittance of the first light transmissive portion of the first pixel including the green color filter is lower than that of the first light transmissive portion of the first pixel including the blue color filter.

Further features of the present invention will become apparent from the following description of exemplary embodiments with reference to the attached drawings.

BRIEF DESCRIPTION OF THE DRAWINGS

FIG. 1 is a schematic plan view of a solid-state image sensor of a reference example;

FIG. 2 is a sectional view taken along a line A-B in FIG. 1;

FIG. 4A is a plan view of a first pixel in the reference example;

FIG. 4B is a plan view of a second pixel in the reference example;

FIG. 14 is a schematic plan view of a solid-state image sensor of the second embodiment.

DESCRIPTION OF THE EMBODIMENTS

Figure 3A:
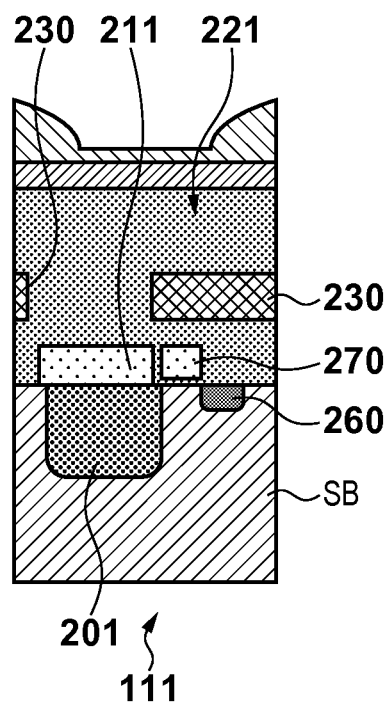
FIG. 3A is a sectional view taken along a line C-D in FIG. 1.

FIG. 1 is a schematic plan view of a solid-state image sensor 10 of a reference example. The solid-state image sensor 10 includes a pixel array 110 in which a plurality of pixels are arranged to form a plurality of rows and a plurality of columns. In the solid-state image sensor 10, the plurality of pixels forming the pixel array 110 include a plurality of first pixels 111 and a plurality of second pixels 112. In the first embodiment, the first pixels 111 are low sensitive pixels, and the second pixels 112 are highly sensitivity pixels. However, the first pixels 111 may also be highly sensitivity pixels, and the second pixels may also be low sensitive pixels. The dynamic range can be widened by generating one signal based on signals of the first pixels 111 and second pixels 112.

The solid-state image sensor 10 includes a row selecting circuit 130 for selecting a row of the pixel array 110, a readout circuit 140 for reading out signals output from pixels on a selected row of the pixel array 110, and an output circuit 150 for processing signals output from the readout circuit 140 and outputting the processed signals. The readout circuit 140 can be designed to output, to the output circuit 150, signals read out from the first pixel 111 and second pixel 112 adjacent to each other as separate signals. Alternatively, the readout circuit 140 may synthesize signals read out from the first pixel 111 and second pixel 112 adjacent to each other into one signal, and output the synthetic signal to the output circuit 150. The readout circuit 140 may also include an A/D converter, and a processing circuit for processing a signal converted by the A/D converter.

Figure 3B:
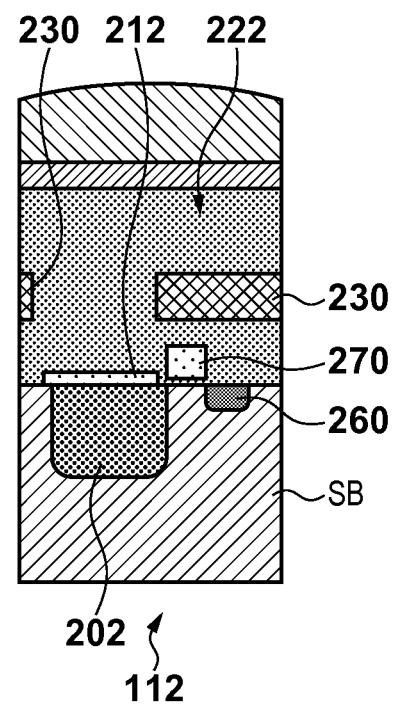
FIG. 3B is a sectional view taken along a line E-F in FIG. 1.

FIG. 2 is a sectional view taken along a line A-B in FIG. 1. FIG. 3A is a sectional view taken along a line C-D in FIG. 1. FIG. 3B is a sectional view taken along a line E-F in FIG. 1. FIGS. 4A and 4B are plan views of the first pixel 111 and second pixel 112, respectively. The first pixel 111 includes a first photoelectric converter 201, and a first light transmissive portion 221 arranged above the first photoelectric converter 201. The second pixel 112 includes a second photoelectric converter 202, and a second light transmissive portion 222 arranged above the second photoelectric converter 202. The first and second photoelectric converters 201 and 202 can be formed in a semiconductor substrate SB. The first and second light transmissive portions 221 and 222 have different light transmittances. In the reference example, the first pixel 111 is a low sensitive pixel, and the second pixel 112 is a highly sensitivity pixel, so the light transmittance of the first light transmissive portion 221 is made lower than that of the second light transmissive portion 222. In other words, the ratio of the amount of light reaching the first photoelectric converter 201 to the amount of light having entered the first light transmissive portion 221 is lower than the ratio of the amount of light reaching the second photoelectric converter 202 to the amount of light having entered the second light transmissive portion 222.

The first light transmissive portion 221 includes a first light attenuating film 211, the second light transmissive portion 222 includes a second light attenuating film 212, and the lower surfaces of the first and second light attenuating films 211 and 212 can exist at the same height with respect to the surface of the semiconductor substrate SB. The first and second light attenuating films 211 and 212 function as members for attenuating light.

The first light transmissive portion 221 can include a first insulating film 215. The first insulating film 215 is in contact with the first light attenuating film 211 and made of a material different from that of the first light attenuating film 211. The second light transmissive portion 222 can include a second insulating film 216. The second insulating film 216 is in contact with the second light attenuating film 212 and made of a material different from that of the second light attenuating film 212. When the first and second light attenuating films 211 and 212 are made of the same material, the thickness of the first light attenuating film 211 is made larger than that of the second light attenuating film 212 so as to make the light transmittance of the first light transmissive portion 221 lower than that of the second light transmissive portion 222. The first and second light attenuating films 211 and 212 can be made of, for example, polysilicon. The first and second light attenuating films 211 and 212 respectively cover at least portions of the first and second photoelectric converters 201 and 202.

The first pixel 111 can have a first opening OP1 formed in a light-shielding layer 230, and the second pixel 112 can have a second opening OP2 formed in the light-shielding layer 230. In the light-shielding layer 230, a portion that defines the first opening OP1 and a portion that defines the second opening OP2 can be either continuous or separated from each other. The light-shielding layer 230 may also function as a wiring layer.

The solid-state image sensor 10 can include a color filter layer 240 above the first and second light transmissive portions 221 and 222. The solid-state image sensor 10 can also include an optical member array (for example, a microlens array) 250 above the first and second light transmissive portions 221 and 222, for example, above the color filter layer 240. The optical member array 250 can include first optical members 251 formed for the first pixels 111, and second optical members 252 formed for the second pixels 112. In the reference example as described above, to form the first pixel 111 as a low sensitive pixel and the second pixel 112 as a highly sensitivity pixel, the light transmittance of the first light transmissive portion 221 is made lower than that of the second light transmissive portion 222. Under the condition, the amount of light entering the first light transmissive portion 221 through the first optical member 251 is preferably smaller than that of light entering the second light transmissive portion 222 through the second optical member 252. This makes it possible to increase the sensitivity difference between the first and second pixels 111 and 112, and widen the dynamic range. The first optical member 251 can be, for example, a parallel plate member or a microlens (for example, a concave lens or convex lens). The second optical member 252 can be a microlens.

When the solid-state image sensor 10 is designed as a MOS sensor, each of the first and second pixels 111 and 112 can have a transfer gate 270 for transferring an electric charge stored in the first or second photoelectric converter 201 or 202 to a floating diffusion 260.

Figure 5:
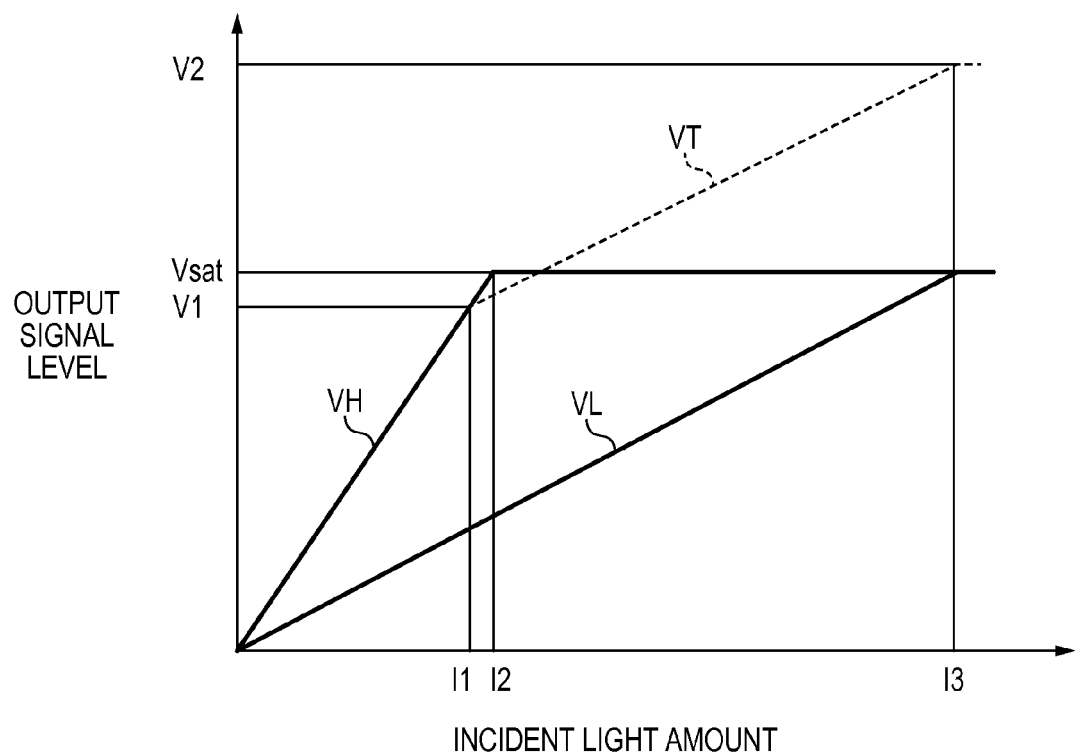
FIG. 5 is a view for explaining the widening of a dynamic range.

The widening of the dynamic range will be explained with reference to FIG. 5. The level (voltage) of a signal VH of the first pixel 111 formed as a highly sensitivity pixel becomes a saturated level Vsat corresponding to a saturated charge quantity with a light amount I2. Since the saturated level of a pixel varies, the signal VH of the first pixel 111 formed as a highly sensitivity pixel is used to a level V1 corresponding to a highly linear light amount I1, and a signal VL of the second pixel 112 formed as a low sensitive pixel is used after the light amount I1 is exceeded. A synthetic signal VT can be obtained by adding the level of the signal VL to the level V1 of the signal VH corresponding to the light amount I1. Consequently, a detectable light amount becomes 0 to I3, and the dynamic range widens.

Figure 6:
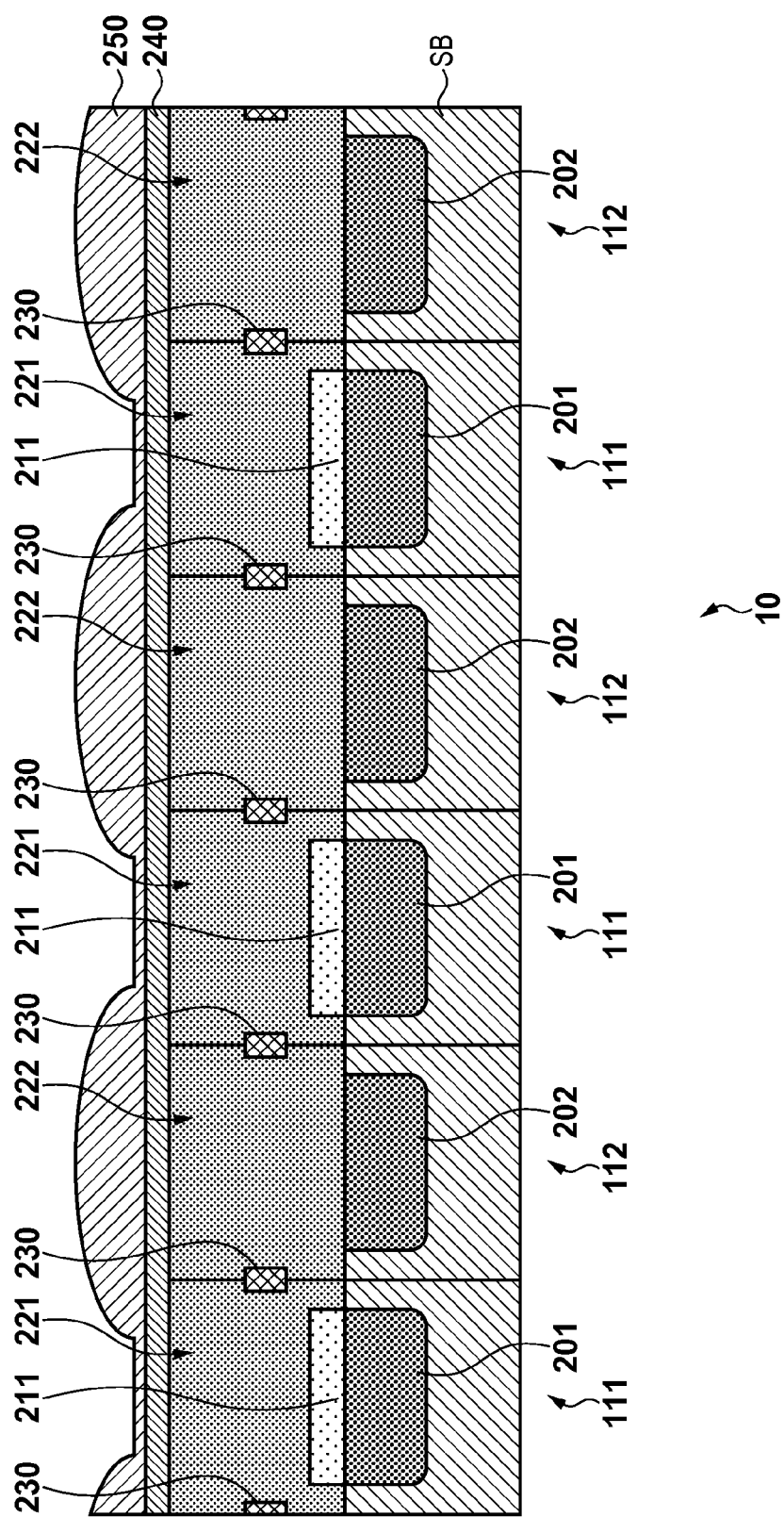
FIG. 6 is a sectional view taken along the line A-B in FIG. 1 in the reference example.
Figure 7A:
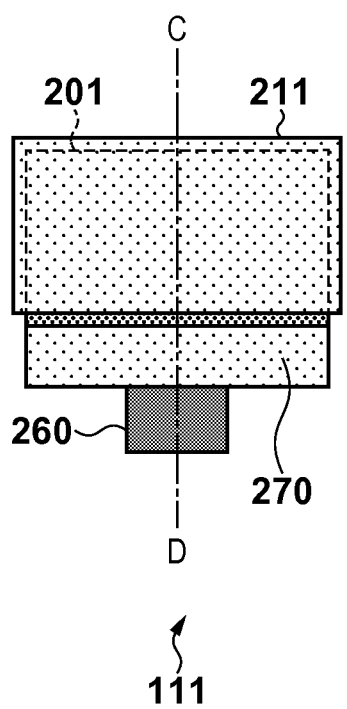
FIG. 7A is a plan view of the first pixel in the reference example.
Figure 7B:
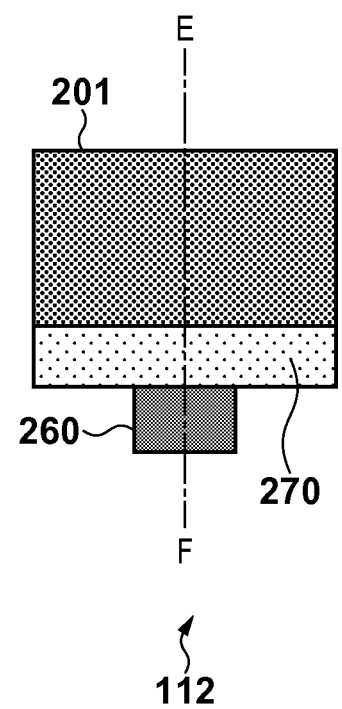
FIG. 7B is a plan view of the second pixel in the reference example.
Figure 8:
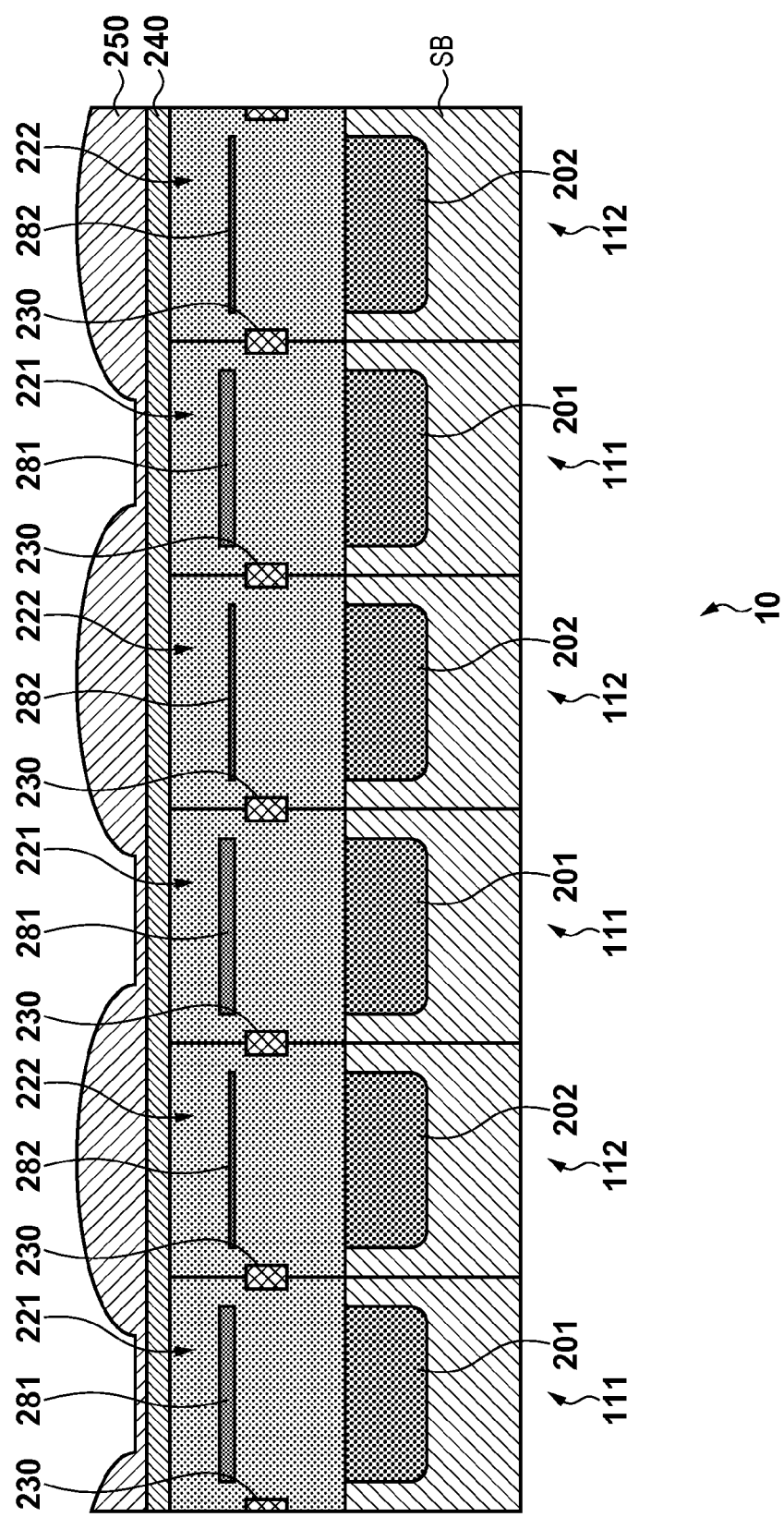
FIG. 8 is a sectional view taken along the line A-B in FIG. 1 in the reference example.
Figure 9A:
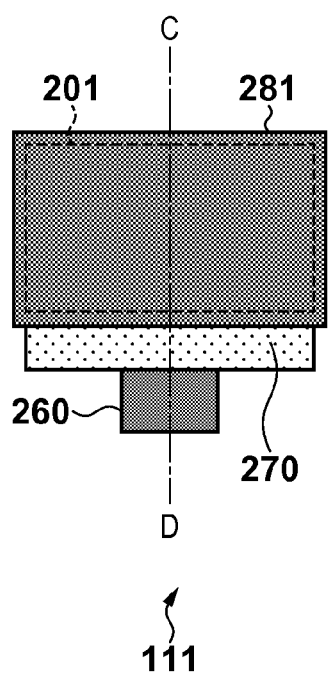
FIG. 9A is a plan view of the first pixel in the reference example.
Figure 9B:
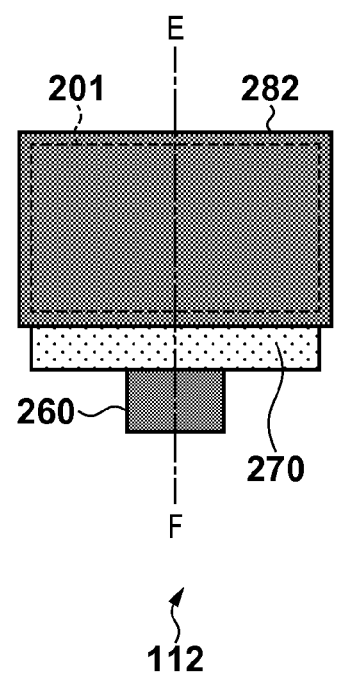
FIG. 9B is a plan view of the second pixel in the reference example.
Figure 10A:
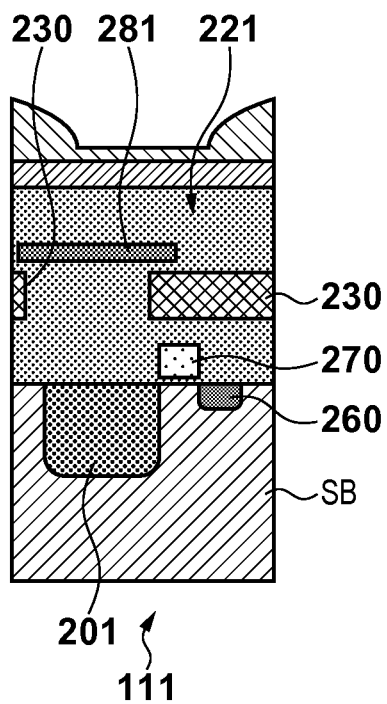
FIG. 10A is a sectional view taken along the line C-D in FIG. 1 in the reference example.
Figure 10B:
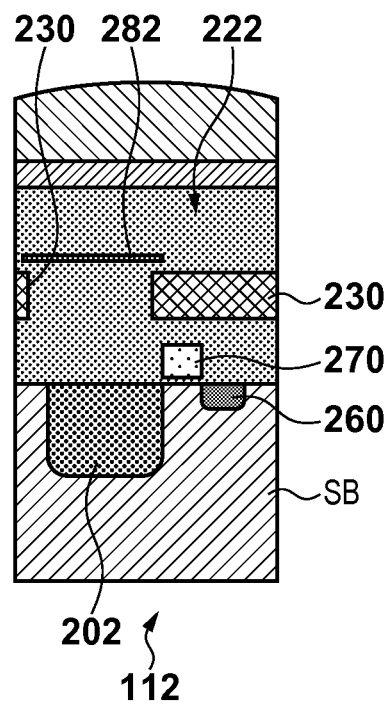
FIG. 10B is a sectional view taken along the line E-F in FIG. 1 in the reference example.

In the example shown in FIGS. 2, 3A, 3B, 4A, and 4B, the light transmittances of the first and second light transmissive portions 221 and 222 are made different from each other by making the light transmittances of the first and second light attenuating films 211 and 212 of the first and second light transmissive portions 221 and 222 different from each other. Instead, as shown in FIGS. 6, 7A, and 7B, the light transmittances of the first and second light transmissive portions 221 and 222 can also be made different from each other by removing the second light attenuating film 212 of the second light transmissive portion 222.

FIGS. 8, 9A, 9B, 10A, and 10B illustrate first and second light attenuating films 281 and 282 that can be formed instead of or together with the first and second light attenuating films 211 and 212. The first and second light attenuating films 281 and 282 can be arranged in positions higher than the transfer gate 270 with respect to the surface of the semiconductor substrate SB. Each of the first and second light attenuating films 281 and 282 can be formed by a metal film or metal compound film having a thickness so determined as to transmit light.

Figure 11:
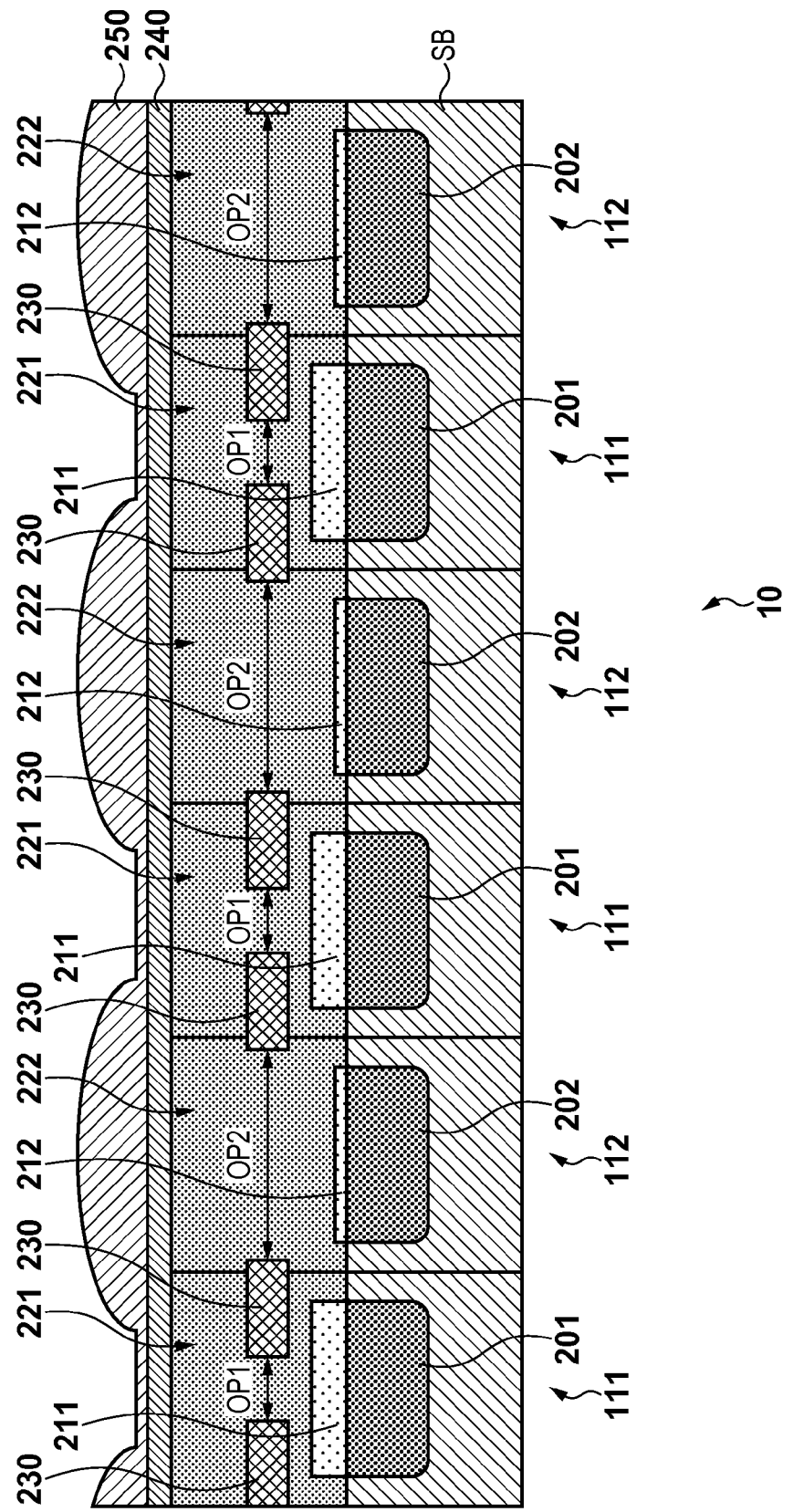
FIG. 11 is a sectional view taken along the line A-B in FIG. 1 in the reference example.

As shown in FIG. 11, in the arrangement in which the light transmittance of the first light transmissive portion 221 is lower than that of the second light transmissive portion 222, the area of the first opening OP1 of the first pixel 111 may be made smaller than that of the opening OP2 of the second pixel 112. This makes it possible to increase the sensitivity difference between the first and second pixels 111 and 112, and widen the dynamic range.

Figure 12:
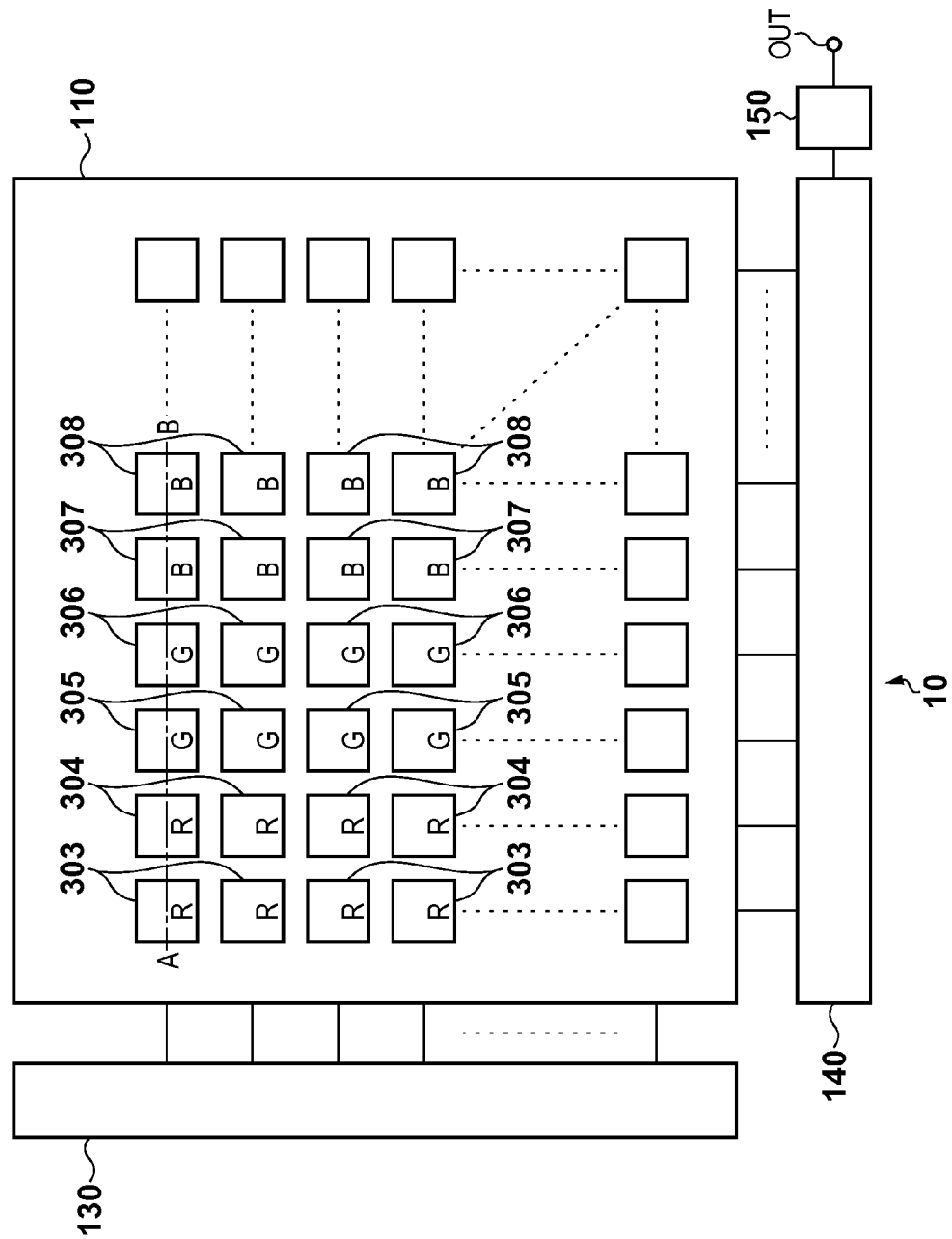
FIG. 12 is a schematic plan view of a solid-state image sensor of the first embodiment.
Figure 13:
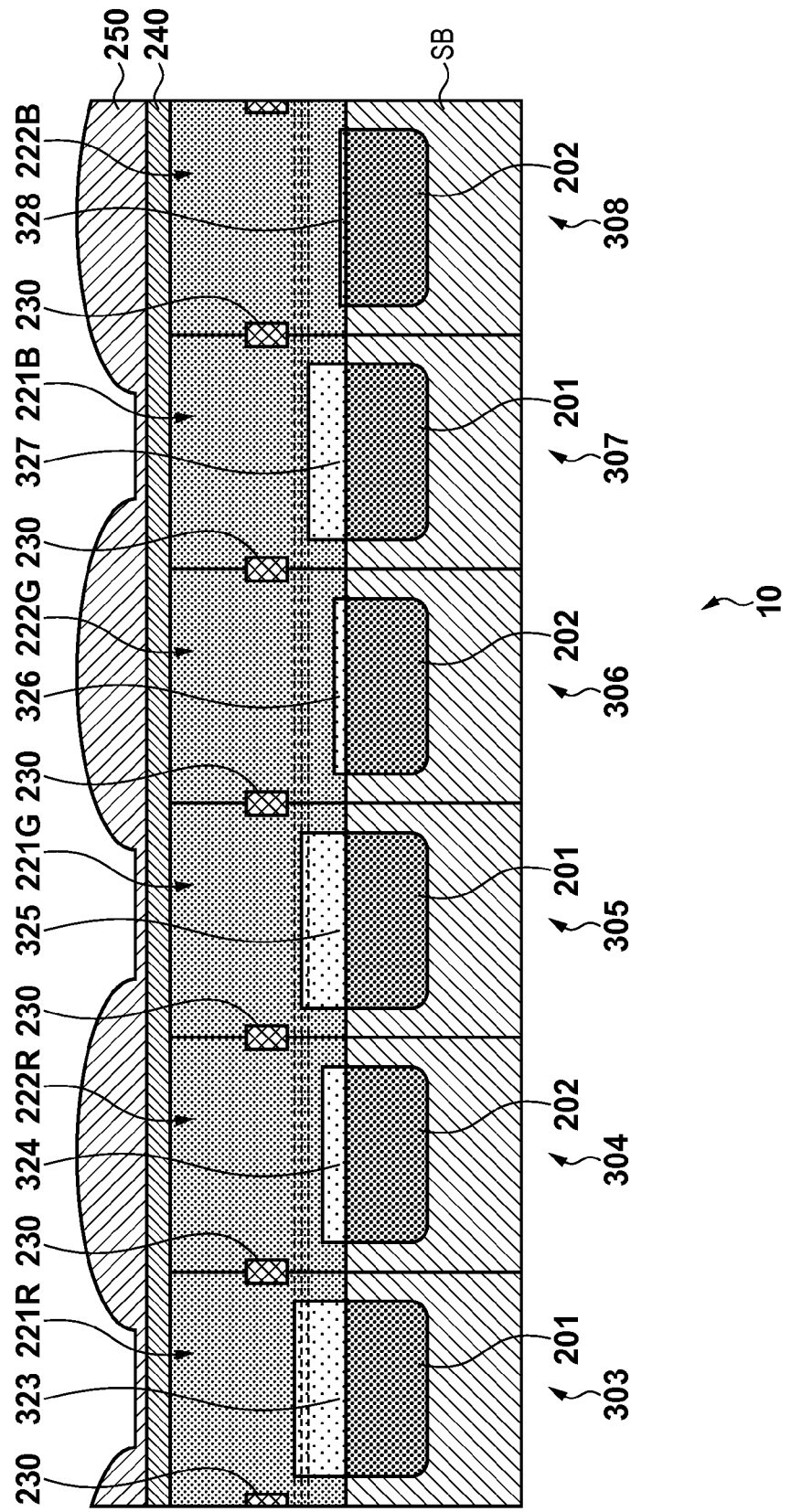
FIG. 13 is a sectional view taken along a line A-B in FIG. 12.

A solid-state image sensor 10 of the first embodiment of the present invention will be explained with reference to FIGS. 12 and 13. Note that items not mentioned in the first embodiment can follow those of the reference example. FIG. 12 is a schematic plan view of the solid-state image sensor 10 of the first embodiment of the present invention. FIG. 13 is a sectional view taken along a line A-B in FIG. 12. The solid-state image sensor 10 of the first embodiment includes red (R) pixels 303 and 304, green (G) pixels 305 and 306, and blue (B) pixels 307 and 308. The color of a pixel is determined by the color of a color filter arranged in a color filter layer 240. That is, the pixels 303 and 304 are pixels including color filters of red (for example, a first color), the pixels 305 and 306 are pixels including color filters of green (for example, a second color), and the pixels 307 and 308 are pixels including color filters of blue (for example, a third color).

Of the red pixels 303 and 304, the pixel 303 corresponds to the first pixel 101 in the reference example, and the pixel 304 corresponds to the second pixel 102 in the reference example. Similarly, of the green pixels 305 and 306, the pixel 305 corresponds to the first pixel 101 in the reference example, and the pixel 306 corresponds to the second pixel 102 in the reference example. Of the blue pixels 307 and 308, the pixel 307 corresponds to the first pixel 101 in the reference example, and the pixel 308 corresponds to the second pixel 102 in the reference example.

In the first embodiment, the light transmittance of a first light transmissive portion 221 of the first pixel having a color filter of a given color is different from that of the first light transmissive portion 221 of the first pixel having a color filter of a different color.

A more practical example will be explained below. The red pixels 303 and 304 have the peak of the spectral sensitivity characteristic at a wavelength near, for example, 600 nm. The pixel 303 is the first pixel as a low sensitive pixel, and the pixel 304 is the second pixel as a highly sensitivity pixel. The green pixels 305 and 306 have the peak of the spectral sensitivity characteristic at a wavelength near, for example, 550 nm. The pixel 305 is the first pixel as a low sensitive pixel, and the pixel 306 is the second pixel as a highly sensitivity pixel. The blue pixels 307 and 308 have the peak of the spectral sensitivity characteristic at a wavelength near, for example, 450 nm. The pixel 307 is the first pixel as a low sensitive pixel, and the pixel 308 is the second pixel as a highly sensitivity pixel.

The red first pixel 303 includes a first photoelectric converter 201, and a first light transmissive portion 221R arranged above the first photoelectric converter 201. The red second pixel 304 includes a second photoelectric converter 202, and a second light transmissive portion 222R arranged above the second photoelectric converter 202. The green first pixel 305 includes a first photoelectric converter 201, and a first light transmissive portion 221G arranged above the first photoelectric converter 201. The green second pixel 306 includes a second photoelectric converter 202, and a second light transmissive portion 222G arranged above the second photoelectric converter 202. The blue first pixel 307 includes a first photoelectric converter 201, and a first light transmissive portion 221B arranged above the first photoelectric converter 201. The blue second pixel 308 includes a second photoelectric converter 202, and a second light transmissive portion 222B arranged above the second photoelectric converter 202. First light attenuating films 323, 325, and 327 of the first light transmissive portions 221R, 221G, and 221B and second light attenuating films 324, 326, and 328 of the second light transmissive portions 222R, 222B, and 222G can be made of, for example, polysilicon.

A light transmittance R1 of the first light transmissive portion 221R is lower than a light transmittance R2 of the second light transmissive portion 222R. A light transmittance G1 of the first light transmissive portion 221G is lower than a light transmittance G2 of the second light transmissive portion 222G. A light transmittance B1 of the first light transmissive portion 221B is lower than a light transmittance B2 of the second light transmissive portion 222B. Also, R1<G1<B1 and R2<G2<B2 hold.

A film thickness TR1 of the first light transmissive portion 221R is larger than a film thickness TR2 of the second light transmissive portion 222R. A film thickness TG1 of the first light transmissive portion 221G is larger than a film thickness TG2 of the second light transmissive portion 222G. A film thickness TB1 of the first light transmissive portion 221B is larger than a film thickness TB2 of the second light transmissive portion 222B. Also, TR1>TG1>TB1 and TR2>TG2>TB2 hold.

Polysilicon has a spectral sensitivity characteristic by which the light transmittance increases toward a long-wavelength side in the wavelength region of visible light. Accordingly, when the first light attenuating films 323, 325, and 327 and second light attenuating films 324, 326, and 328 are made of polysilicon, the color balance worsens if their film thicknesses are determined without taking account of the spectral sensitivity characteristic of polysilicon. In the second embodiment, therefore, first light attenuating films 323, 325, and 327 and second light attenuating films 324, 326, and 328 are formed such that R1<G1<B1 and R2<G2<B2 (TR1>TG1>TB1 and TR2>TG2>TB2) hold.

A solid-state image sensor 10 of the second embodiment of the present invention will be explained with reference to FIG. 14. Note that items not mentioned in the second embodiment can follow those of the first embodiment. In the second embodiment, as shown in FIG. 14, a red (R) pixel group (303 and 304), a green (G) pixel group (305 and 306), and a blue (B) pixel group (307 and 308) form a Bayer array. The red pixel group includes one first pixel (low sensitive pixel) 303 and three second pixels (highly sensitivity pixels) 304. The green pixel group includes one first pixel (low sensitive pixel) 305 and three second pixels (highly sensitivity pixels) 306. The blue pixel group includes one first pixel (low sensitive pixel) 307 and three second pixels (highly sensitivity pixels) 308. In this arrangement, the barycenter of a low sensitive pixel can be positioned close to that of (three) highly sensitivity pixels forming the same pixel group as that of the low sensitive pixel. The second embodiment is also applicable to another color filter array.

The features of the present invention do not limit the structure of a pixel and the method of a solid-state image sensor. For example, the present invention is applicable to MOS solid-state image sensors having various pixel arrangements, and is also applicable to CCD solid-state image sensors having various pixel arrangements.

As an application example of the solid-state image sensor according to each of the above embodiments, a camera incorporating the solid-state image sensor will be explained below. The concept of the camera includes not only an apparatus whose main purpose is imaging, but also an apparatus (for example, a personal computer or portable terminal) having an imaging function as an auxiliary function. The camera can include the solid-state image sensor according to the present invention exemplified in the above-mentioned embodiments, and a processing unit that processes an output signal from the solid-state image sensor. This processing unit can include an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-048489, filed Mar. 11, 2013, which is hereby incorporated by reference herein in its entirety.

What is claimed is:

1. A solid-state image sensor comprising a plurality of first pixels each including one of a red color filter, a green color filter, and a blue color filter, and a plurality of second pixels each including one of a red color filter, a green color filter, and a blue color filter, wherein
  each of the plurality of first pixels includes a first photoelectric converter, and a first light transmissive portion having a first light attenuating film and arranged above the first photoelectric converter, and each of the plurality of second pixels includes a second photoelectric converter, and a second light transmissive portion having a second light attenuating film and arranged above the second photoelectric converter,
  the first and the second light attenuating films for the same color are configured such that light transmittances of the first and second light transmissive portions of the same color are different, and
  the first attenuating film is further configured such that a light transmittance of the first light transmissive portion of the first pixel including the red color filter is lower than that of the first light transmissive portion of the first pixel including the green color filter, and a light transmittance of the first light transmissive portion of the first pixel including the green color filter is lower than that of the first light transmissive portion of the first pixel including the blue color filter.

2. The sensor according to claim 1, wherein
the first pixel has a first opening formed in a light-shielding layer, and the second pixel has a second opening formed in the light-shielding layer, and
a light transmittance of the first light transmissive portion is lower than that of the second light transmissive portion, and an area of the first opening is smaller than that of the second opening.

3. The sensor according to claim 1, wherein
the first pixel includes a first optical member above the first light transmissive portion, and the second pixel includes a second optical member above the second light transmissive portion, and
a light transmittance of the first light transmissive portion is lower than that of the second light transmissive portion, and an amount of light entering the first light transmissive portion through the first optical member is smaller than that of light entering the second light transmissive portion through the second optical member.

4. The sensor according to claim 1, wherein the first light transmissive portions of the plurality of first pixels and the second light transmissive portions of the plurality of second pixels are arranged below a layer where the red, green and blue color filters of the plurality of first pixels and the red, green and blue color filters of the plurality of second pixels are arranged.

5. The sensor according to claim 1, wherein the first photoelectric converters of the plurality of first pixels and the second photoelectric converters of the plurality of second pixels have the same size.

6. A solid-state image sensor, comprising a plurality of first pixels each including one of a red color filter, a green color filter, and a blue color filter, and a plurality of second pixels each including one of a red color filter, a green color filter, and a blue color filter, wherein
  each of the plurality of first pixels includes a first photoelectric converter, and a first light transmissive portion arranged above the first photoelectric converter, and each of the plurality of second pixels includes a second photoelectric converter, and a second light transmissive portion arranged above the second photoelectric converter, in the first pixel and the second pixel including color filters of the same color, light transmittances of the first light transmissive portion and the second light transmissive portion are different from each other,
  a light transmittance of the first light transmissive portion of the first pixel including the red color filter is lower than that of the first light transmissive portion of the first pixel including the green color filter, and a light transmittance of the first light transmissive portion of the first pixel including the green color filter is lower than that of the first light transmissive portion of the first pixel including the blue color filter, and
  the first photoelectric converter and the second photoelectric converter are formed in a semiconductor substrate, the first light transmissive portion includes a first light attenuating film, the second light transmissive portion includes a second light attenuating film, and the first light attenuating film and the second light attenuating film are made of the same material and have thicknesses different from each other.

7. The sensor according to claim 6, wherein lower surfaces of the first light attenuating film and the second light attenuating film exist at the same height with respect to a surface of the semiconductor substrate.

8. The sensor according to claim 6, wherein the first light transmissive portion includes a first insulating film contacting the first light attenuating film and made of a material different from that of the first light attenuating film, and the second light transmissive portion includes a second insulating film contacting the second light attenuating film and made of a material different from that of the second light attenuating film.

9. The sensor according to claim 6, wherein the first light attenuating film and the second light attenuating film are made of polysilicon.

10. The sensor according to claim 6, wherein each of the first light attenuating film and the second light attenuating film is formed by one of a metal film and a metal compound film whose thickness is determined such that light is transmitted.

11. A camera comprising:
  a solid-state image sensor comprising a plurality of first pixels, each including one of a red color filter, a green color filter, and a blue color filter, and a plurality of second pixels, each including one of a red color filter, a green color filter, and a blue color filter; and
  a processing unit configured to process an output signal from the solid-state image sensor, wherein
  each of the plurality of first pixels further includes a first photoelectric converter, and a first light transmissive portion having a first light attenuating film and arranged above the first photoelectric converter and each of the sluralit of second sixels further includes a second photoelectric converter, and a second light transmissive portion having a second light attenuating film and arranged above the second photoelectric converter,
  the first and second light attenuating films for the same color are configured such that light transmittances of the first and second light transmissive portions of the same color are different from each other, and
  the first attenuating film is further configured such that a light transmittance of the first light transmissive portion of the first pixel including the red color filter is lower than that of the first light transmissive portion of the first pixel including the green color filter, and a light transmittance of the first light transmissive portion of the first pixel including the green color filter is lower than that of the first light transmissive portion of the first pixel including the blue color filter.

12. A solid-state image sensor comprising a plurality of first pixels each including one of a red color filter, a green color filter, and a blue color filter, and a plurality of second pixels each including one of a red color filter, a green color filter, and a blue color filter, wherein
- each of the plurality of first pixels includes a first photoelectric converter, and a first light transmissive portion arranged above the first photoelectric converter, and each of the plurality of second pixels includes a second photoelectric converter, and a second light transmissive portion arranged above the second photoelectric converter,
- in the first pixel and the second pixel including color filters of the same color, light transmittances of the first light transmissive portion and the second light transmissive portion of the same color are different from each other,
- a light transmittance of the first light transmissive portion of the first pixel including the red color filter is lower than that of the first light transmissive portion of the first pixel including the green color filter, and a light transmittance of the first light transmissive portion of the first pixel including the green color filter is lower than that of the first light transmissive portion of the first pixel including the blue color filter, and
- the first light transmissive portion includes a first light attenuating film, the second light transmissive portion includes a second light attenuating film, and the first light attenuating film and the second light attenuating film are made of the same material and have thicknesses different from each other.

* * * * *